United States Patent
Janardhanan et al.

(10) Patent No.: US 10,686,456 B2
(45) Date of Patent: Jun. 16, 2020

(54) CYCLE SLIP DETECTION AND CORRECTION IN PHASE-LOCKED LOOP

(71) Applicant: TEXAS INSTRUMENTS INCORPORATED, Dallas, TX (US)

(72) Inventors: Jayawardan Janardhanan, Issaquah, WA (US); Christopher Andrew Schell, Tacoma, WA (US); Sinjeet Dhanvantray Parekh, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/218,970

(22) Filed: Dec. 13, 2018

(65) Prior Publication Data

US 2019/0280700 A1    Sep. 12, 2019

Related U.S. Application Data

(60) Provisional application No. 62/640,611, filed on Mar. 9, 2018.

(51) Int. Cl.
*H03L 7/099*      (2006.01)
*G04F 10/00*      (2006.01)
(Continued)

(52) U.S. Cl.
CPC .......... *H03L 7/0991* (2013.01); *G04F 10/005* (2013.01); *H03L 7/083* (2013.01); *H03L 7/093* (2013.01)

(58) Field of Classification Search
CPC ....... H03L 7/0991; H03L 7/083; H03L 7/093; G04F 10/005
See application file for complete search history.

(56) References Cited

U.S. PATENT DOCUMENTS 5,200,933 A    4/1993    Thornton et al.
5,304,954 A    4/1994    Saito et al.
(Continued)

FOREIGN PATENT DOCUMENTS

EP    0644657    3/1995
EP    3182592    6/2017
(Continued)

OTHER PUBLICATIONS

International Search Report in corresponding PCT Application No. PCT/US2019/021599 dated May 30, 2019 (2 pages).
(Continued)

*Primary Examiner* — Kabir A Timory
(74) *Attorney, Agent, or Firm* — John R. Pessetto; Charles A. Brill; Frank D. Cimino

(57) ABSTRACT

A digital phase-locked loop (DPLL) includes a voltage-controlled oscillator to generate an output clock, a filter coupled to the voltage-controlled oscillator, and a time-to-digital converter (TDC) that receives a reference clock and a feedback clock. The feedback clock is derived from the output clock. The TDC generates a digital output value. The DPLL also includes a cycle slip detector circuit coupled to the TDC. The cycle slip detector circuit detects a cycle slip based on the digital output value and adjusts the digital output value by a second digital value that corresponds to an integer multiple of a period of the reference clock.

9 Claims, 4 Drawing Sheets

(51) Int. Cl.
*H03L 7/093* (2006.01)
*H03L 7/083* (2006.01)

(56) References Cited

U.S. PATENT DOCUMENTS

| | | | |
|---|---|---|---|
| 5,389,898 | A | 2/1995 | Taketoshi et al. |
| 5,796,682 | A | 8/1998 | Swapp |
| 5,959,502 | A | 9/1999 | Ovens et al. |
| 6,308,055 | B1 | 10/2001 | Welland et al. |
| 6,310,653 | B1 | 10/2001 | Malcolm, Jr. et al. |
| 6,584,574 | B1 | 6/2003 | Embree |
| 6,597,249 | B2 | 7/2003 | Chien et al. |
| 7,126,429 | B2 | 10/2006 | Mitric |
| 7,427,940 | B2 | 9/2008 | Staszewski et al. |
| 7,755,439 | B2 | 7/2010 | Yu et al. |
| 7,876,136 | B2 | 1/2011 | Ha et al. |
| 8,179,174 | B2 | 5/2012 | Bunch |
| 8,368,438 | B2 | 2/2013 | Furuta |
| 8,957,711 | B2 | 2/2015 | Jin et al. |
| 9,020,089 | B2 | 4/2015 | Da Dalt |
| 9,490,820 | B2 | 11/2016 | Shiozaki |
| 9,634,826 | B1 | 4/2017 | Park et al. |
| 9,859,901 | B1 | 1/2018 | Chu et al. |
| 10,075,173 | B2 | 9/2018 | Sarda |
| 10,128,858 | B2 | 11/2018 | Goldberg et al. |
| 10,135,452 | B2 | 11/2018 | Cherniak et al. |
| 10,141,941 | B2 | 11/2018 | Petrov |
| 10,185,349 | B2 | 1/2019 | Musunuri et al. |
| 10,193,561 | B2 | 1/2019 | Lesso |
| 10,200,047 | B2 | 2/2019 | Markulic et al. |
| 10,291,214 | B2 | 5/2019 | Thijssen et al. |
| 2007/0085570 | A1 | 4/2007 | Matsuta |
| 2009/0015338 | A1 | 1/2009 | Frey |
| 2009/0219073 | A1 | 9/2009 | Sun et al. |
| 2009/0267664 | A1 | 10/2009 | Uozumi et al. |
| 2010/0134335 | A1 | 6/2010 | Park et al. |
| 2011/0234270 | A1 | 9/2011 | Kobayashi |
| 2011/0273210 | A1 | 11/2011 | Nagaraj |
| 2012/0056769 | A1 | 3/2012 | Wang et al. |
| 2012/0161834 | A1 | 6/2012 | Lee et al. |
| 2013/0051290 | A1 | 2/2013 | Endo et al. |
| 2014/0225653 | A1 | 8/2014 | Hara et al. |
| 2014/0266351 | A1 | 9/2014 | Na et al. |
| 2014/0266354 | A1 | 9/2014 | Boo et al. |
| 2015/0077279 | A1 | 3/2015 | Song et al. |
| 2015/0188553 | A1* | 7/2015 | Familia ............... H03L 7/097 327/5 |
| 2015/0372690 | A1 | 12/2015 | Tertinek et al. |
| 2016/0056827 | A1 | 2/2016 | Vlachogiannakis et al. |
| 2016/0156362 | A1 | 6/2016 | Kim et al. |
| 2016/0164532 | A1 | 6/2016 | Zhang et al. |
| 2016/0204787 | A1 | 7/2016 | Lotfy et al. |
| 2016/0238998 | A1 | 8/2016 | Pavlovic et al. |
| 2016/0352506 | A1* | 12/2016 | Huang ............... H04L 7/0332 |
| 2016/0380759 | A1 | 12/2016 | Kondo et al. |
| 2017/0187383 | A1 | 6/2017 | Lesso |
| 2017/0288686 | A1 | 7/2017 | Burg et al. |
| 2017/0324416 | A1 | 11/2017 | Jakobsson |
| 2018/0269885 | A1 | 9/2018 | Kondo et al. |
| 2018/0351558 | A1* | 12/2018 | Kuo ............... H03L 1/00 |

FOREIGN PATENT DOCUMENTS

| | | |
|---|---|---|
| JP | H11143570 | 5/1999 |
| JP | 2009260866 | 11/2009 |
| RU | 2154895 | 8/2000 |
| WO | 2008089460 | 7/2008 |
| WO | 2015161890 | 10/2015 |
| WO | 2017174142 | 10/2017 |

OTHER PUBLICATIONS

International Search Report in corresponding PCT Application No. PCT/US2019/032261 dated Aug. 29, 2019 (2 pages).
Michael H. Perrott, "Tutorial on Digital Phase-Locked Loops;" CICC 2009. Sep. 2009 (118 pgs).
Texas Instruments Data Sheet LMK05028 Low-Jitter Dual-Channel Network Synchronizer Clock with EEPROM, Feb. 2018 (94 pages).
International Search Report in corresponding PCT Application No. PCT/US2019/030892 dated Aug. 1, 2019 (3 pages).
International Search Report in corresponding PCT Application No. PCT/US2019/021968 dated Jun. 13, 2019 (2 pages).
International Search Report in corresponding PCT Application No. PCT/US2019/021966 dated Jun. 20, 2019 (2 pages).
International Search Report in corresponding PCT Application No. PCT/US2019/021605 dated Oct. 31, 2019 (2 pages).

* cited by examiner

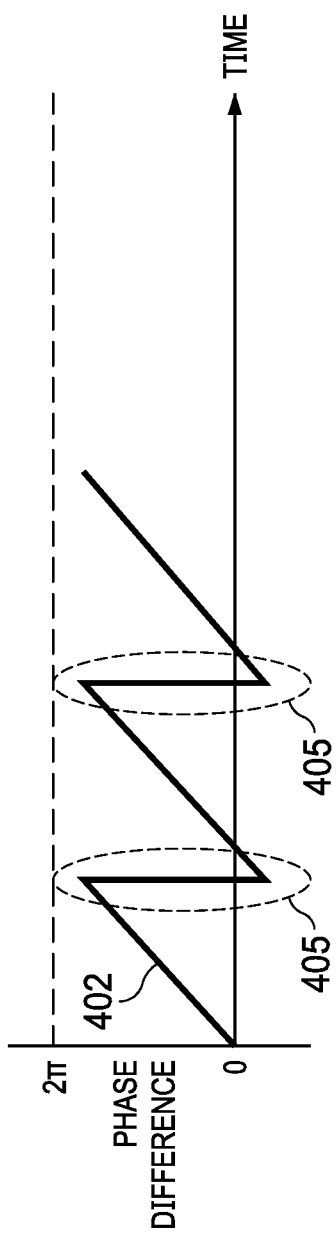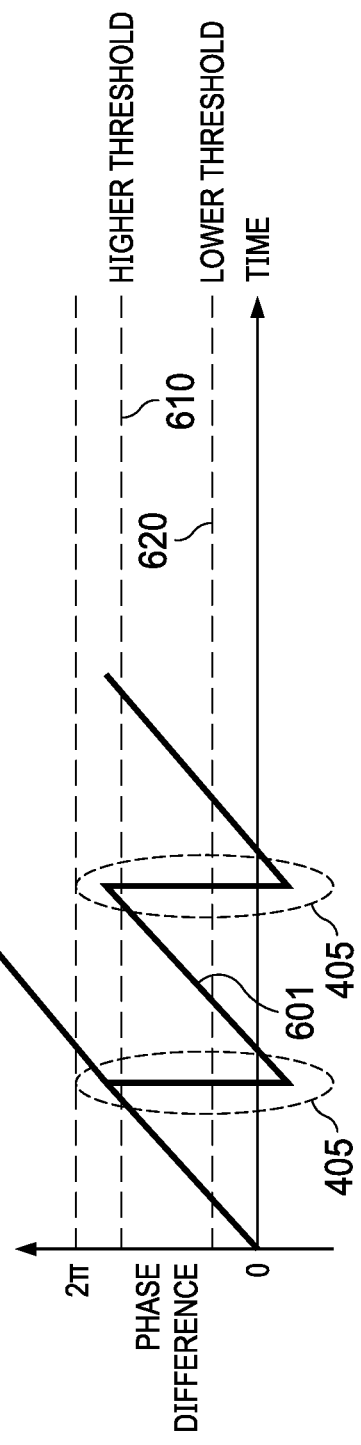

CYCLE SLIP DETECTION AND CORRECTION IN PHASE-LOCKED LOOP

RELATED APPLICATIONS

This application claims priority to U.S. Provisional Application No. 62/640,611, filed Mar. 9, 2018, which is hereby incorporated by reference.

BACKGROUND

A digital phase-locked loop (DPLL) generates an output dock that the DPLL phase locks to an input reference clock. A DPLL includes a time-to-digital converter (TDC) that generates a digital output value that is a function of the phase difference between corresponding edges of the reference clock and a feedback clock derived from the output clock. Based on the digital signal from the TDC, the output clock frequency from a voltage-controlled oscillator is adjusted to maintain phase lock.

SUMMARY

In some embodiments, a digital phase-locked loop (DPLL) includes a voltage-controlled oscillator to generate an output clock, a filter coupled to the voltage-controlled oscillator, and a time-to-digital converter (TDC) that receives a reference clock and a feedback clock. The feedback clock is derived from the output clock. The TDC generates a digital output value. The DPLL also includes a cycle slip detector circuit coupled to the TDC. The cycle slip detector circuit detects a cycle slip based on the digital output value and adjusts the digital output value by a second digital value that corresponds to an integer multiple of a period of the reference clock.

In another example, a method includes repeatedly determining a first digital value from a time-to-digital converter, the first digital value indicative of a time difference between edges of a first clock and a second clock and then determining that the first digital value changes by more than a threshold amount. The method further includes changing the first digital value by a second digital value corresponding to a period of the first clock to produce a modified digital output value.

BRIEF DESCRIPTION OF THE DRAWINGS

For a detailed description of various examples, reference will now be made to the accompanying drawings in which:

FIG. 4 illustrates cycle slips in which the phase difference between the reference and feedback clocks wraps around at a $2\pi$ (360 degrees) phase difference.

FIG. 6 illustrates the correction that the cycle slip detector circuit generates for the output of the TDC in the event of a cycle slip.

DETAILED DESCRIPTION

As noted above, a DPLL continually monitors the phase difference between a reference clock and the output clock from the DPLL and adjusts the frequency of the VCO to correct for any phase difference. The reference clock may be an externally supplied clock signal to the DPLL. The frequency, and thus the period, of the reference clock is generally maintained at a constant frequency/period. However, the cycle to cycle period of the reference clock may change a little. For example, due to jitter, the period of the reference clock may slowly increase over the course of 100 cycles and then slowly decrease over the next 100 cycles, but the overall average of the reference clock's period over a large number of cycles remains constant. It is possible that the phase difference between the reference and output clock increases cycle of the reference clock, at which point the phase difference wraps around from $2\pi$ to 0, also referred to as a "cycle slip." Cycle slips can be accommodated in a DPLL in that eventually the DPLL will relock the phase of the output clock to the reference clock. However, relocking the phase of the output clock may take a relatively long period of time for most DPLLs. The DPLL disclosed herein, however, includes a cycle slip detector circuit that immediately detects a cycle slip event and corrects the phase accordingly.

Figure 1:
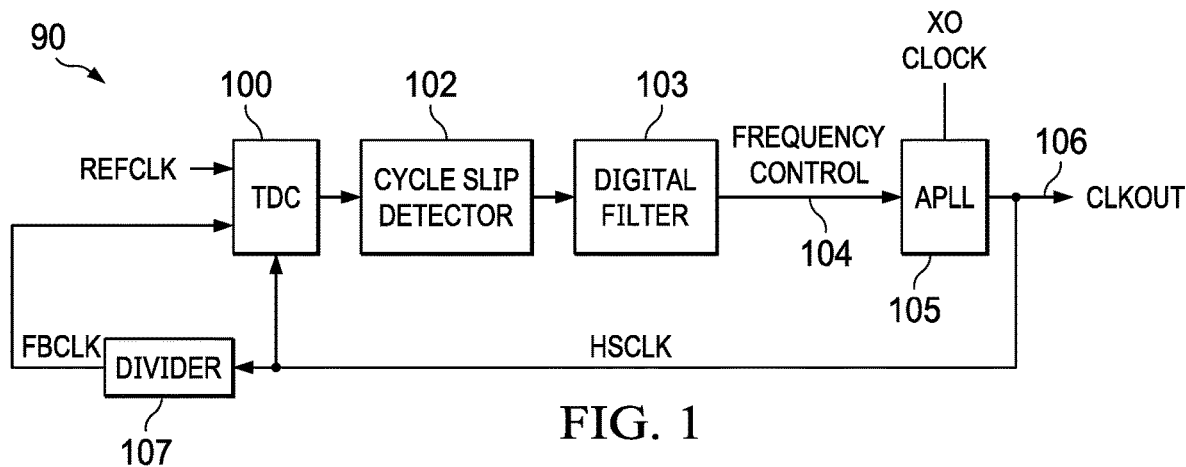
FIG. 1 illustrates a DPLL in accordance with an example.

FIG. 1 provides an example of a DPLL 90. The example of FIG. 1 includes a TDC circuit 100 (also referred to as TDC 100), a cycle slip detector circuit 102, a digital filter 103, an analog phase-locked loop (APLL) 105, and a frequency divider 107. The reference clock input to the APLL 105 is a crystal oscillator clock in some examples. The output clock (CLK OUT) 106 from the APLL 105 is a periodic signal generated by the APLL 105 and is phase-aligned to an input reference clock (REFCLK). The frequency of CLK OUT 106 may be a higher frequency than REFCLK and thus the frequency divider 107 is included to divide down the frequency to match that of the input reference clock. The output signal from the frequency divider 107 is a feedback clock (FBCLK). FBCLK thus is derived from CLK OUT 106. The TDC circuit 100 functions to determine the time between corresponding edge of REFCLK and FBCLK. The digital filter 103 filters the TDC's output count value to generate a frequency control signal 104 to adjust the frequency and/or phase of CLK OUT 106 by the APLL 105. The CLK OUT 106 of the APLL 105 also is used as a high-speed clock (HSCLK) to sample the input reference clock and FBCLK within the TDC 100. The term "high speed" should not be interpreted as imparting any particular frequency to HSCLK, other than its frequency is generally greater than the frequency of the input reference or feedback clocks. The TDC determines the phase difference between REFCLK and a clock that is derived from CLK OUT. The clock derived from CLK OUT may be CLK OUT itself or a frequency divided version of CLK OUT (as in the case of the example of FIG. 1). That is, FBCLK provided to the TDC 100 may be either CLK OUT or a frequency divided version of CLK OUT.

Figure 2:
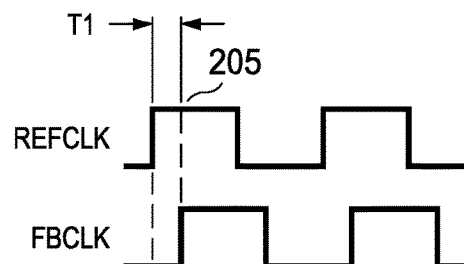
FIG. 2 shows a waveform in which a feedback clock lags the reference clock.
Figure 3:
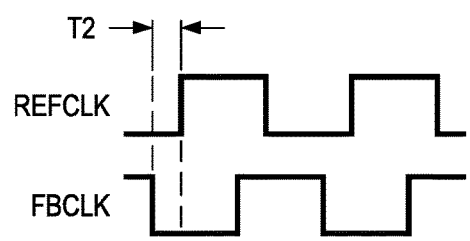
FIG. 3 shows a waveform in which the feedback clock leads the reference clock.

As explained above, the TDC circuit 100 determines the time difference between corresponding edges of REFCLK and FBCLK. Referring briefly to FIG. 2, a timing diagram example is shown in which a rising edge of REFCLK occurs before a rising edge of the FBCLK, and the TDC circuit 100 determines the time difference T1 as shown. FIG. 3 shows an example of a timing diagram in which a rising edge of FBCLK occurs before a rising edge of REFCLK, and the TDC circuit 100 determines the time difference T2 as shown.

FIG. 4 shows a progression of the phase difference between REFCLK and FBCLK in the face of, for example, jitter on REFCLK. As noted above, the inter-cycle period of REFCLK may creep up over the course of a number of cycles due to jitter or other effects. When this happens, the phase difference determined by TDC 100 increases as well, as shown at 402. Eventually, as shown at 405, the phase difference reaches 2π (360 degrees) and then immediately wraps around to 0π The nature of the TDC 100 illustrated in FIG. 5 and discussed below cause the wrap around to occur just shy of the 2π phase error point, but the wrap-around occurs by a value that equals 2π. That is, after the wrap around, the TDC output is a value that is a little less than 0π (slightly negative) as shown in FIG. 2. The cycle slip events illustrated at 405 can be corrected by some DPLLs but only after a significantly long period of time (e.g., minutes). The cycle slip detector 102 of FIG. 1 detects a cycle clip event and corrects for it immediately.

Figure 5:
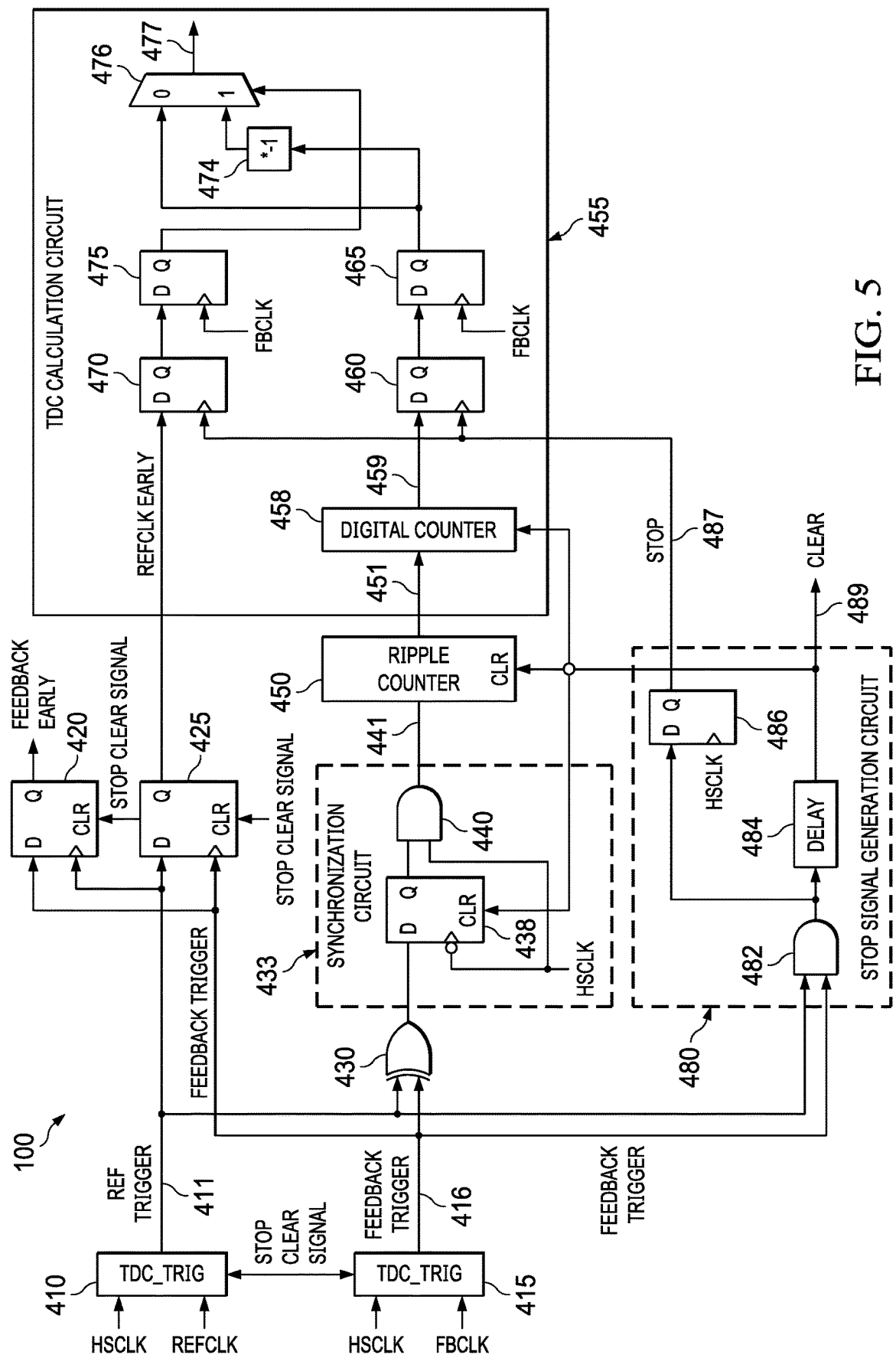
FIG. 5 shows an example implementation of a TDC circuit.

FIG. 5 shows an example of TDC 100. TDC 100 includes TDC trigger circuits (TDC_TRIG) 410 and 415, flip-flops 420 and 425, logic gate 430, synchronization circuit 433, ripple counter 450, TDC calculation circuit 455, and stop signal generation circuit 480. The TDC 100 determines the time difference between corresponding edges of the REFCLK and FBCLK. REFCLK is provided to an input of TDC trigger circuit 410 and FBCLK is provided to an input of TDC trigger circuit 415. Another input of each of the TDC trigger circuits 410, 415 is the high-speed clock (HSCLK). Each trigger circuit 410, 415 synchronizes its input signal (REFCLK or FBCLK) to an edge of the HSCLK. The output signal 411 from the TDC trigger circuit 410 is designated as REF Trigger and transitions from low to high (or vice versa depending what is considered to be an active edge) when REFCLK is high when and HSCLK transitions from low to high. That is, REFCLK transitioning from low to high causes a corresponding transition in REF Trigger upon the next active edge of HSCLK. Similarly, the output signal 416 from the TDC trigger circuit 415 is designated as Feedback Trigger and transitions from low to high when FBCLK is high and when HSCLK transitions from low to high. That is, FBCLK transitioning from low to high causes a corresponding transition in Feedback Trigger upon the next active edge of HSCLK.

Logic gate 430 is shown in the example of FIG. 1 as being an exclusive-OR gate (and is referred to herein as exclusive-OR gate 430), but could be implemented as other logic gates or combinations of logic gates. The inputs of exclusive-OR gate 430 include the REF Trigger signal 411 and the Feedback Trigger signal 416. The output of the exclusive-OR gate 430 is provided to the synchronization circuit 433. The output of the exclusive-OR gate 430 is a logic high when one, but not both, of the REF Trigger and the Feedback Trigger signals 1411 and 416 are logic high, that is, upon occurrence of the earliest rising edge of REFCLK or FBCLK.

The synchronization circuit 433 includes a D flip-flop 438 and an AND gate 440. The D flip-flop 438 includes a data input (D), a clock input and an output (Q). The output signal from the exclusive-OR gate 430 is provided to the D input of flip-flop 438. The HSCLK is provided to the clock input of the D flip-flop and the output Q is coupled to an input of AND gate 440. The other input of AND gate 440 also receives HSCLK. When the first of the active edge of REF Trigger 411 or Feedback Trigger 416 is received, the output of the exclusive-OR gate 430 becomes a logic high. Upon the next active edge of HSCLK, the logic high on the D input of flip-flop 438 is latched through to the output Q of the flip-flop, and, with HSCLK still being high causes the synchronization output signal 441 of the AND gate 440 to be high. The output of AND gate 140 represents the input to ripple counter 450.

In some examples, the ripple counter 450 is implemented as an asynchronous counter comprising multiple serially-connected flip-flops where an input flip-flop is clocked by an external clock, and each subsequent flip-flop is clocked by the output of the preceding flip-flop. The external clock that clocks the input flip-flop of ripple counter 450 is the synchronization output signal 441 from AND gate 440. The count output 451 of the ripple counter 150 is provided as an input to the TDC calculation circuit 455.

The TDC calculation circuit 455 includes digital counter 458, flip-flops 460, 465, 470, 475, two's complement circuit 474, and a multiplexer 476. The digital counter 458 counts active edges of the output 451 from the ripple counter 450 and provides an output count value 459. The combination of ripple counter 450 and digital counter 458 represents a counter circuit.

Referring still to the example of FIG. 5, stop signal generation circuit 480 includes an AND gate 482, a delay element 484, and a D flip-flop 486. The inputs to AND gate 482 comprise the REF Trigger signal 411 and the Feedback Trigger signal 416 from the TDC trigger circuits 410 and 415, respectively. When both the REF Trigger signal 411 and the Feedback Trigger signal 416 are high, the output of AND gate 482 becomes a logic high. Both the REF Trigger signal 411 and the Feedback Trigger signal 416 being high represents the stop condition when the counting process should cease. The output of the AND gate 482 is latched into D flip-flop 486 upon occurrence of the next active edge of HSCLK. The Q output of D flip-flop 486 represents the STOP signal 487 and is provided to the TDC calculation circuit 455 and used to clock flip-flops 460 and 470. Flip-flop 460 latches in the count value 459 from the digital counter 458 upon occurrence of an active edge of the STOP signal 487. The FBCLK signal is then used to latch the count output of flip-flop 460 by flip-flop 465 to thereby synchronize the count value to the FBCLK.

The delay element 484 delays the output of AND gate 482 to provide a CLEAR signal 489. The CLEAR signal 489 is essentially a delayed version of the STOP signal 487 with enough of a delay to ensure that the CLEAR signal 489 is asserted high at a time that that the count value from the digital counter 458 has been fully latched through flip-flops 460 and 470. The CLEAR signal 489 is provided to the clear inputs of the flip-flop 438, the ripple counter 450, the digital counter 458, and flip-flops 420 and 425. The CLEAR signal 489 resets these components in preparation for the generation of a new count value from the ripple and digital counters 450 and 458.

The active edge of FBCLK may come before or after the corresponding active edge of REFCLK. The condition in which the active edge of REFCLK occurs before the active edge of FBCLK represents a positive count value. The condition in which the REFCLK's active edge occurs after that of FBCLK represents a negative count value. Thus, the count value from the digital counter 458 may need to be modified to, for example, convert it to a negative count value if the active edge of FBCLK precedes that of REFCLK. Flip-flops 420 and 425 are provided to determine whether the count value is to be converted to a negative value. Flip-flop 420 latches the Feedback Trigger signal 416 using REF Trigger 411 as a clock signal, and flip-flop 425 latches the REF Trigger signal 411 using Feedback Trigger 416 as a clock signal. The output of flip-flop 420 is designated as the Feedback Early signal and when asserted high indicates that the active edge of FBCLK occurred before the corresponding active edge of REFCLK. The output of flip-flop 425 is designated as the REFCLK Early signal and, when asserted high, indicates that the active edge of REFCLK occurred before the corresponding active edge of FBCLK. In some examples, the Feedback Early output signal from flip-flop 420 is not used and in some examples, flip-flop 420 is not present. In some examples, however, the REFCLK Early signal from flip-flop 425 is latched into flip-flop 470 of the TDC calculation circuit 455 using the STOP signal 487 and the output of flip-flop 470 is latched into flip-flop 475 using FBCLK to align the REFCLK Early signal to FBCLK.

The output of flip-flop 475 being asserted low indicates that active edge of REFCLK precedes that of FBCLK and the output of flip-flop 475 being asserted high indicates that FBCLK's active edge precedes that of REFCLK. The output of flip-flop 475 is used as a control signal to control the selection of the inputs to multiplexer 476. One input of multiplexer 476 (the "0" input) is the latched count value from flip-flop 465. The other input to the multiplexer 476 (the "1" input) is the two's complement of the count value from flip-flop 465. The bits of the count value from the flip-flop 465 is converted to a two's complement form by two's complement circuit 474. In one example, the two's complement circuit 474 inverts each of the bits of the output count value from flip-flop 465 and then adds 1 to the least significant bit of that result. The output 477 from the multiplexer 476 represents the digital output value (either positive or negative) from TDC 100 that encodes the time difference between corresponding edges of REFCLK and FBCLK. The digital output value 477 from TDC 100 is provided to the cycle slip detector circuit 102.

The cycle clip detector circuit 102 of FIG. 1 detects a cycle slip in the phase difference between REFCLK and FBCLK. Examples of cycle slips are shown in FIG. 4 at 405. The cycle clip detector circuit 102 not only detects a cycle slip, but also corrects the TDC digital output value 477 for the cycle slip. FIG. 6 shows a phase difference plot over time with the same cycle slips 405 that would have occurred absent the cycle slip detector circuit 102, as shown in FIG. 4. The cycle slip detector circuit 102 detects a cycle slip based on the digital output value 277 from TDC 100, and then adjusts the digital output value 277 by a second digital value that corresponds to an integer multiple of a period of REFCLK. As such, whereas the TDC 100 digital output value experiences a sudden change by a value that is equal to $2\pi$ the period of REFCLK, the adjustment made by the cycle slip detector circuit 102 causes its output value to be a digital value that corresponds to value that is $2\pi$ different than the TDC's digital output value. In the example of FIG. 6, the digital output from the cycle slip detector circuit 102 is illustrated by line 602. Line 602 represents line 601 shifted upward by a value that corresponds to a full period of REFCLK. As such, the digital filter 103 receives a continually increasing (and correct) digital value from the cycle slip detector circuit 102 rather than a sudden and large $2\pi$ drop as otherwise would have been the case absent the cycle slip detector circuit 102. The same response by the cycle slip detector circuit 102 occurs when the phase difference is negative and increases to larger negative values.

The cycle slip detector circuit 102 receives the digital output value from TDC 100 and determines when the TDC's digital output value changes by more than a threshold amount. If the TDC's digital output value changes by more than a threshold amount, the cycle slip detector circuit 102 adjusts the TDC's digital output value by a value that corresponds to an integer multiple of the period of REFCLK. FIG. 6 shows two illustrative threshold levels—a higher threshold 610 and a lower threshold 620. In one example, the higher threshold 610 corresponds to digital output value that is three-fourths of the period of REFCLK, and the lower threshold 620 corresponds to digital output value that is one-fourth of the period of REFCLK. In one implementation, the cycle slip detector circuit 102 adjusts the digital output value from the TDC 100 when the TDC's digital output value changes from a level that is greater than the higher threshold 610 to a level that is lower than the lower threshold 620 over the course of one or a few clock cycles of HSCLK (the clock that clocks the TDC 100).

The TDC digital output value 477 can be positive or negative as explained above and thus two sets of thresholds are implemented to detect a cycle slip when either the phase difference is positive and increasing to larger positive values as shown in FIG. 6 or is negative and increasing to larger negative values. In one example, the positive threshold levels are $\frac{3}{4}*T$ and $\frac{1}{4}*T$ (where T is the period of REFCLK) and $-\frac{3}{4}*T$ and $-\frac{1}{4}*T$. In another example, the upper threshold is $\frac{1}{2}*T$ and the lower threshold corresponds to a sign change. That is, a cycle slip is detected if the previous value is greater than $\frac{1}{2}*T$ and there is a sign change with the current value.

Figure 7:
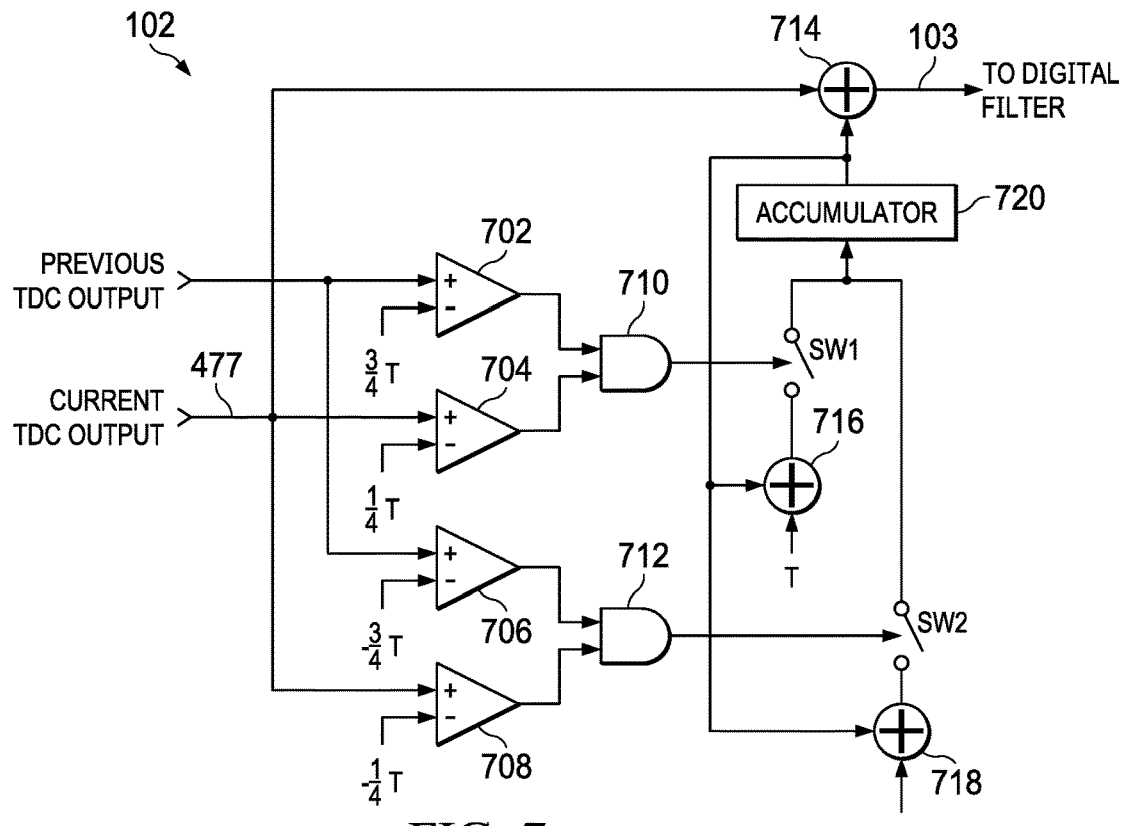
FIG. 7 illustrates an example implementation of the cycle slip detector circuit.

FIG. 7 includes an example implementation of the cycle clip detector circuit 102. In this example implementation, cycle slip detector 102 includes digital comparators 702, 704, 706, and 708, AND gates 710 and 712, switches SW1 and SW2, adders 714, 716, and 718, and accumulator 720. Each comparator has a positive input, a negative input and an output. The negative inputs of comparator 704 and 708 receive the current digital output value 477 from TDC 100. The positive inputs of comparator 702 and 706 receive a previous digital output value from TDC 100, for example, the immediately preceding digital output value from the TDC which may be temporarily stored in a register, memory, captured in a set of latches, etc. The negative input of comparator 702 receives a digital value that corresponds to $\frac{3}{4}*T$. The positive input of comparator 704 receives a digital value that corresponds to $\frac{1}{4}*T$. The negative input of comparator 706 receives a digital value that corresponds to $-\frac{3}{4}*T$. The positive input of comparator 708 receives a digital value that corresponds to $-\frac{1}{4}*T$.

The output of comparator 702 is a logic high when the TDC's previous digital output value is larger than the digital value that corresponds to $\frac{3}{4}*T$, and logic low otherwise. The output of comparator 704 is a logic high when the TDC's current digital output value is smaller than the digital value that corresponds to $\frac{1}{4}*T$, and logic low otherwise. Comparators 706 and 708 function similar to comparators 702 and 704, but for negative values of the current and previous TDC digital output values. The output of comparator 706 is a logic high when the TDC's previous digital output value is larger than the digital value that corresponds to $-\frac{3}{4}*T$ (i.e., more negative than the $-\frac{3}{4}*T$), and logic low otherwise. The output of comparator 708 is a logic high when the TDC's current digital output value is smaller than the digital value that corresponds to $-\frac{1}{4}*T$ (i.e., less negative than $-\frac{1}{4}*T$), and logic low otherwise.

The outputs of comparators 702 and 704 are provided to inputs of AND gate 710, and the outputs of comparators 706 ande 708 are provided to inputs of AND gate 712. The output of AND gate 710 is logic high when the TDC's previous digital output value is greater than ¾*T and the TDC's current digital output value is smaller than ¼*T. That particular condition occurs upon the occurrence of a cycle slip. Thus, the output of AND gate 710 being logic high signifies the occurrence of a cycle slip for positive values of the TDC digital output value. When the AND gate's output becomes a logic high, switch SW1 is caused to be closed to thereby adding (via adder 716) a digital value (T) that corresponds to a full cycle of REFCLK to the current value in the accumulator 720. The resulting new value in the accumulator (which is an integer multiple of T) is added to the current TDC digital output value via adder 714.

In a similar fashion, the output of AND gate 712 is logic high when the TDC's previous digital output value is greater than −¾*T and the TDC's current digital output value is smaller than −¼*T. That particular condition occurs upon the occurrence of a cycle slip when the TDC digital output value was formerly more negative than the threshold corresponding to −¾*T and then subsequently changes to a value that is less negative than the threshold corresponding to −¼*T. Thus, the output of AND gate 712 being logic high signifies the occurrence of a cycle slip for negative values of the TDC digital output value. When the output of AND gate 712 becomes a logic high, switch SW2 is caused to be closed to thereby adding (via adder 716) a digital value −T that corresponds to a full cycle of REFCLK to the current value in the accumulator 720 (i.e., subtracting T). The resulting new value in the accumulator (which is an integer multiple of T) is added to the current TDC digital output value via adder 714.

Figure 8:
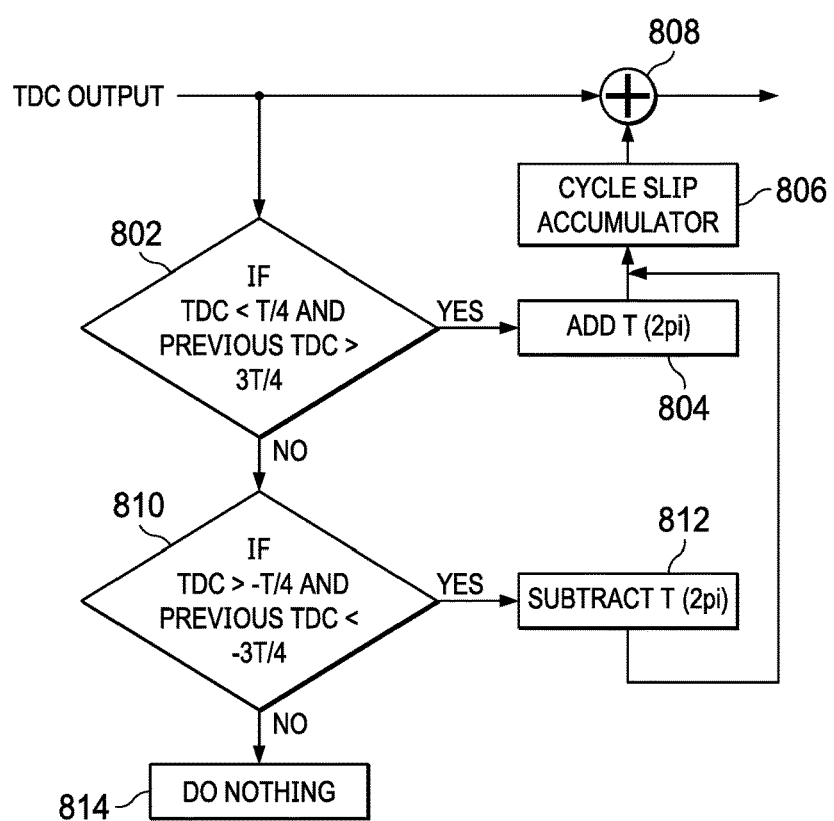
FIG. 8 shows an example method performed by the cycle slip detector circuit.

FIG. 8 is a flow chart corresponding to the operation of the cycle slip detector 102. At 802, the method includes determining whether the current TDC digital output value is less than ¼*T (or whatever value is configured for the lower threshold) and the previous TDC digital output value was greater than ¾*T (or whatever value is configured for the higher threshold). If that condition is true ("Y" branch), T is added at 804 to the value in the accumulator (806) and the current TDC digital output value is added at 808 to the value in the accumulator. If this condition is not true ("N" branch), the method includes at 810 determining whether the current TDC digital output value is greater than −¼*T (less negative than −¼*T) and the previous TDC digital output value was less than −¾*T (more negative than −¾*T). When the condition of 810 resolves to true (the "Y" branch), T is subtracted at 812 from the value in the accumulator. If neither condition is true, which is the case if no cycle slip is present, then no adjustment is made (814) to the current TDC digital output value.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A digital phase-locked loop (DPLL), comprising:
    an analog phase-locked loop to generate an output clock;
    a filter coupled to the analog phase-locked loop;
    a time-to-digital converter (TDC) coupled to receive a reference clock and a feedback clock, the feedback clock derived from the output clock, the TDC to generate a digital output value; and
    a cycle slip detector circuit coupled to the TDC, the cycle slip detector circuit to detect a cycle slip based on the digital output value and to adjust the digital output value by a second digital value that corresponds to an integer multiple of a period of the reference clock;
    wherein the cycle slip detector circuit includes a plurality of comparators, each comparator including the TDC's digital output value as an input;
    wherein the second digital value is either a positive value corresponding to one period of the reference clock or a negative value also corresponding to one period of the reference clock, and wherein the cycle slip detector circuit further includes:
    an accumulator;
    a first adder to add the positive value to the accumulator responsive to a first set of signals from some of the comparators; and
    a second adder to add the negative value to the accumulator responsive to a second set of signals from other of the comparators.

2. The DPLL of claim 1, wherein the cycle slip detector circuit is to detect that the digital output value from the TDC changes by more than a threshold amount.

3. The DPLL of claim 2, wherein the cycle slip detector circuit is to add or subtract the second digital value to or from the TDC's digital output value responsive to detection that the TDC's digital output value has changed by more than the threshold amount.

4. The DPLL of claim 1, wherein TDC's digital output value adjusted by the second digital value is to be provided to the filter.

5. A digital phase-locked loop (DPLL), comprising:
    a time-to-digital converter (TDC) coupled to receive a reference clock and a feedback clock, the TDC to generate a digital output value; and
    a cycle slip detector circuit coupled to the TDC, the cycle slip detector circuit to detect a cycle slip based on the digital output value and to adjust the digital output value by a second digital value that corresponds to an integer multiple of a period of the reference clock;
    wherein the cycle slip detector circuit includes a plurality of comparators, each comparator including the TDC's digital output value as an input;
    wherein the second digital value is either a positive value corresponding to one period of the reference clock or a negative value also corresponding to one period of the reference clock, and wherein the cycle slip detector circuit further includes:
    an accumulator;
    a first adder to add the positive value to the accumulator responsive to a first set of signals from some of the comparators; and
    a second adder to add the negative value to the accumulator responsive to a second set of signals from other of the comparators.

6. The DPLL of claim 5, wherein the cycle slip detector circuit is to detect that the digital output value from the TDC changes by more than a threshold amount.

7. The DPLL of claim 6, wherein the cycle slip detector circuit is to add or subtract the second digital value to or from the TDC's digital output value responsive to detection that the TDC's digital output value has changed by more than the threshold amount.

8. The DPLL of claim 5, wherein the cycle slip detector circuit is to detect that the digital output value from the TDC changes from a former value that exceeds a first threshold to a subsequent value that exceeds a second threshold.

9. The DPLL of claim 5, wherein the cycle slip detector circuit is to detect that the digital output value from the TDC changes from a former value that exceeds a first threshold to a second value of an opposite sign as the former value.

\* \* \* \* \*